United States Patent
Ando et al.

(10) Patent No.: US 9,984,870 B2
(45) Date of Patent: May 29, 2018

(54) COMBINED REACTIVE GAS SPECIES FOR HIGH-MOBILITY CHANNEL PASSIVATION

(71) Applicants: International Business Machines Corporation, Armonk, NY (US); ULVAC, INC., Chigasaki, Kanagawa (JP)

(72) Inventors: Takashi Ando, Tuckhoe, NY (US); Vijay Narayanan, New York, NY (US); Yohei Ogawa, White Plains, NY (US); John Rozen, Hastings on Hudson, NY (US)

(73) Assignees: INTERNATIONAL BUSINESS MACHINES CORPORATION, Armonk, NY (US); ULVAC, INC., Chigasaki, Kanagawa (JP)

( * ) Notice: Subject to any disclaimer, the term of this patent is extended or adjusted under 35 U.S.C. 154(b) by 0 days. days.

(21) Appl. No.: 15/198,537

(22) Filed: Jun. 30, 2016

(65) Prior Publication Data
US 2018/0005821 A1   Jan. 4, 2018

(51) Int. Cl.
*H01L 21/02* (2006.01)

(52) U.S. Cl.
CPC .... *H01L 21/02304* (2013.01); *H01L 21/0234* (2013.01); *H01L 21/02178* (2013.01); *H01L 21/02181* (2013.01); *H01L 21/02192* (2013.01); *H01L 21/02205* (2013.01); *H01L 21/02274* (2013.01); *H01L 21/02334* (2013.01)

(58) Field of Classification Search
None
See application file for complete search history.

(56) References Cited

U.S. PATENT DOCUMENTS

| | | | |
|---|---|---|---|
| 6,613,695 B2 | 9/2003 | Pomarede et al. | |
| 7,780,793 B2 | 8/2010 | Yang et al. | |
| 8,808,564 B2 | 8/2014 | Rogers et al. | |
| 8,937,336 B2 | 1/2015 | Chen et al. | |
| 9,245,793 B2 | 1/2016 | Limdulpaiboon et al. | |
| 9,299,605 B2 | 3/2016 | Ren et al. | |
| 2006/0292872 A1* | 12/2006 | Haukka | C23C 16/0272 438/680 |
| 2012/0213945 A1* | 8/2012 | Lee | C23C 16/513 427/563 |
| 2015/0380302 A1* | 12/2015 | Mountsier | H01L 21/76831 438/654 |
| 2016/0056033 A1 | 2/2016 | Sardashti et al. | |
| 2017/0103914 A1* | 4/2017 | Damjanovic | H01L 21/76831 |

FOREIGN PATENT DOCUMENTS

| | | |
|---|---|---|
| JP | 2003059899 A | 2/2003 |
| KR | 1020050104824 | 11/2005 |
| KR | 20070044081 A | 4/2007 |
| TW | 200935513 A | 8/2009 |

* cited by examiner

*Primary Examiner* — Shamim Ahmed
(74) *Attorney, Agent, or Firm* — Cantor Colburn LLP; Vazken Alexanian (57) ABSTRACT

A technique relates to in-situ cleaning of a high-mobility substrate. Alternating pulses of a metal precursor and exposure to a plasma of a gas or gas mixture are applied. The gas or gas mixture contains both nitrogen and hydrogen (e.g., $NH_3$). A passivation layer is formed on the high-mobility substrate by alternating pulses of the metal precursor and exposure to the plasma of a gas, or gas mixture, containing both nitrogen and hydrogen.

19 Claims, 10 Drawing Sheets

APPLY TO THE HIGH-MOBILITY SUBSTRATE ALTERNATING PULSES OF A METAL PRECURSOR AND EXPOSURE TO A PLASMA OF A GAS OR A GAS MIXTURE, THE GAS OR THE GAS MIXTURE CONTAINING BOTH NITROGEN AND HYDROGEN 705

FORM A PASSIVATION LAYER ON THE HIGH-MOBILITY SUBSTRATE BY APPLYING THE ALTERNATING PULSES OF THE METAL PRECURSOR AND THE EXPOSURE TO THE PLASMA OF THE GAS OR THE GAS MIXTURE 710

FORM THE INTERFACE LAYER ON THE SUBSTRATE 805

CONVERTING THE INTERFACE LAYER INTO A METAL OXIDE BY ALTERNATING PULSES OF A METAL PRECURSOR AND EXPOSURE TO A PLASMA OF A GAS OR A GAS MIXTURE, THE GAS OR THE GAS MIXTURE CONTAINING BOTH NITROGEN AND HYDROGEN 810

```
┌─────────────────────────────────────────────────────────────────────────────┐
│      FORM ONE OR MORE THREE DIMENSIONAL CHANNELS ON A SUBSTRATE  1005       │
└─────────────────────────────────────────────────────────────────────────────┘
                                      │
                                      ▼
┌─────────────────────────────────────────────────────────────────────────────┐
│ FORM AN INTERFACE LAYER ON TOP OF THE ONE OR MORE THREE DIMENSIONAL CHANNELS, WHEREIN │
│ THE INTERFACE LAYER IS FORMED BY ALTERNATING PULSES OF A METAL PRECURSOR AND EXPOSURE TO A │
│ PLASMA OF A GAS OR A GAS MIXTURE, THE GAS OR THE GAS MIXTURE CONTAINING BOTH NITROGEN │
│                              AND HYDROGEN  1010                             │
└─────────────────────────────────────────────────────────────────────────────┘
```

COMBINED REACTIVE GAS SPECIES FOR HIGH-MOBILITY CHANNEL PASSIVATION

BACKGROUND

The present invention relates to semiconductor devices, and more specifically, to combined reactive gas species for high-mobility channel passivation.

A metal-oxide-semiconductor field-effect transistor (MOSFET) is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on"). A fin type field effect transistor (FET) is a type of MOSFET. FinFET devices include an arrangement of fins disposed on a substrate. The fins are formed from a semiconductor material. A gate stack is arranged over the fins and defines a channel region of the fins, while regions of the fins extending outwardly from the channel region define active source and drain regions of the device. Various state-of-the-art techniques may be used for forming the fin.

A particular obstacle facing the development of metal-oxide semiconductor field-effect transistors with, for example, InGaAs channels is the high density of traps (Dit) at the gate dielectric/III-V semiconductor interface. Typical capacitance-voltage (CV) curves of unpinned metal-oxide-semiconductor capacitors (MOSCAPs) on n-InGaAs show a frequency-dependent "hump" at negative biases, characteristic of midgap Dit response. Studies have focused on $Al_2O_3$ or $HfO_2/Al_2O_3$ bilayers, as $Al_2O_3$ is believed to allow for lower Dit than $HfO_2$. Also, to reduce the Dit, various passivation approaches have been examined in the literature, including treatment with sulfur containing agents, As-decapping, hydrogen plasma, and hydrogenation/nitridization.

Furthermore, obtaining a pristine and/or passivated semiconductor surface without damaging the bulk of the film is critical to gate stack and contact formation in order to improve transfer characteristics (mobility, sub-threshold slope, etc.) and reduce resistivity, respectively. This is particularly challenging for high-mobility semiconductors (such as InGaAs and SiGe) for which a low quality native oxide readily forms after air exposure so that wet chemistry is not sufficient to condition the substrate appropriately. This also adds a queue-time dependence between wet chemical treatment and dielectric gate or metal contact deposition so that the integration is rendered non-practical in a manufacturing setting. On III-V substrates, proposed solutions for bare surfaces are limited due to, for example, the small process compatibility window (e.g., temperature up to 400° C.). Sulfur-containing chemistry only slows oxide regrowth and yields downstream tool contamination.

SUMMARY

According to one or more embodiments, a method of in-situ cleaning of a high-mobility substrate is provided. The method includes applying to the high-mobility substrate alternating pulses of a metal precursor and exposure to a plasma of a gas or gas mixture. The gas or gas mixture contains both nitrogen and hydrogen. The method includes forming a passivation layer on the high-mobility substrate by application of the alternating pulses of the metal precursor and plasma exposure.

According to one or more embodiments, a method of forming an interface layer on a substrate is provided. The method includes forming the interface layer on the substrate, and converting the interface layer into a metal oxide by applying alternating pulses of a metal precursor and exposure to a plasma of a gas or gas mixture. The gas or gas mixture contains both nitrogen and hydrogen.

According to one or more embodiments, a method of forming a semiconductor device is provided. The method includes forming an interface layer on a substrate and exposing the interface layer to a plasma of a gas or a gas mixture, thereby cleaning the interface layer. The gas or the gas mixture contains both nitrogen and hydrogen. This can be followed by in-situ plasma interlayer formation and/or high-k material deposition.

According to one or more embodiments, a method of forming a semiconductor device is provided. The method includes forming one or more three dimensional channels on a substrate and forming an interface layer on top of the one or more three dimensional channels. The interface layer is formed by alternating pulses of a metal precursor and exposure to a plasma of a gas or a gas mixture. The gas or the gas mixture contains both nitrogen and hydrogen.

DETAILED DESCRIPTION

Various embodiments are described herein with reference to the related drawings. Alternative embodiments may be devised without departing from the scope of this document. It is noted that various connections and positional relationships (e.g., over, below, adjacent, etc.) are set forth between elements in the following description and in the drawings. These connections and/or positional relationships, unless specified otherwise, may be direct or indirect, and are not intended to be limiting in this respect. Accordingly, a coupling of entities may refer to either a direct or an indirect coupling, and a positional relationship between entities may be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The preparation of high-mobility materials (also referred to as high-mobility substrates) such as, for example, III-V semiconductors, SiGe substrates, and InGaAs substrates prior to the dielectric gate stack deposition is recognized as being particularly challenging due to the existence of low quality native oxides. One or more embodiments alleviate this problem by passivating and/or depositing a passivation layer on the channel material using gas chemistries inside a deposition tool. This relaxes the dependence on time-sensitive wet clean, thereby decoupling the effect of air exposure as the interface is defined in-situ and enabling tangible manufacturing methods. The channel material is in the substrate, and the channel material is located between the source and drain of a transistor.

Embodiments combine the benefits of reactive H (native oxide removal) and N species (seed layer for nucleation and interlayer scaling) using a plasma of a gas containing at least both elements of H and N (e.g. $NH_3$). Such treatment can be combined with alternating exposure to the plasma and pulses of a metal precursor (such as, e.g., trimethyl aluminum (TMA)) in order to form a passivation layer (e.g., AlO(N)); the passivation layer serves as a seed for the core dielectric material (e.g., $HfO_2$) while providing an interface with the semiconductor with minimum Dit, which correlates with reduced sub-threshold slope in a FET, lower leakage, and improved capacitance scaling for electrostatic control.

To avoid gas phase reaction, the processing chamber is purged between the repeated sequential introduction of the metal precursor and the plasma gas. Radical and atomic species from the nitrogen and hydrogen containing plasma therefore never react in the gas phase with the metal precursor. Such a purge is achieved by flowing gas (e.g., as Ar or $N_2$) and/or by evacuating the chamber using a vacuum pump. The plasma source is turned on only when the gas or gas mixture containing both hydrogen and nitrogen is being introduced to the chamber. A reaction cycle would therefore be a variation of the following: metal precursor pulse, followed by a purge, followed by plasma gas flow, followed by turn plasma on/off, followed by a purge.

The plasma is a method of generating reactive atomic and radical species. For one or more embodiments, it is preferred (but not a necessity) to reduce the kinetic energy of such species so as to avoid damage to the substrate and maximize conformity. Therefore, a remote plasma generator (e.g., inductively coupled) can be used without biasing the substrate. Such setup can be found, for example, in tooling for plasma-enhanced atomic layer deposition (PEALD).

Figure 1:
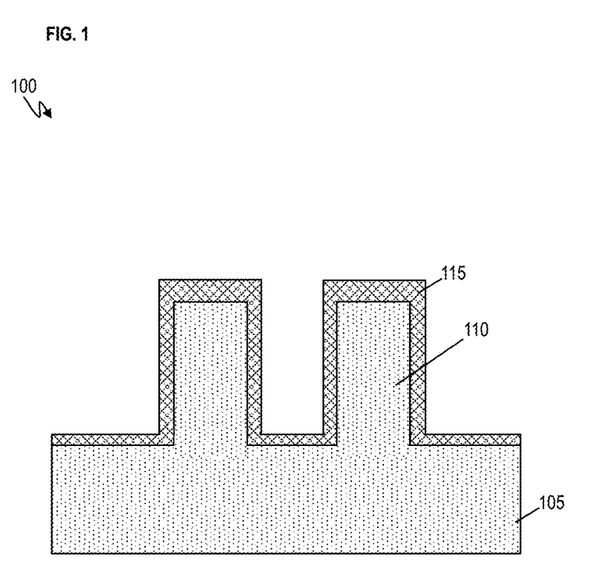
FIG. 1 is a cross-sectional view of a semiconductor device illustrating native oxide growth according to one or more embodiments.
Figure 2:
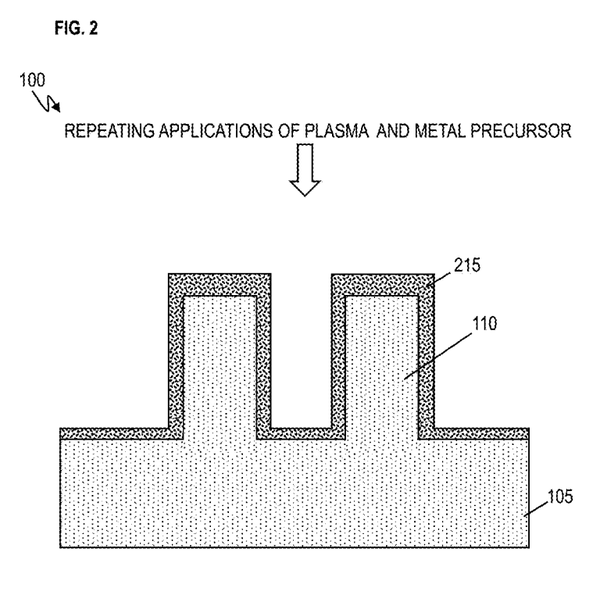
FIG. 2 is a cross-sectional view of a semiconductor device illustrating etching and conversion of the native oxide according to one or more embodiments.
Figure 3:
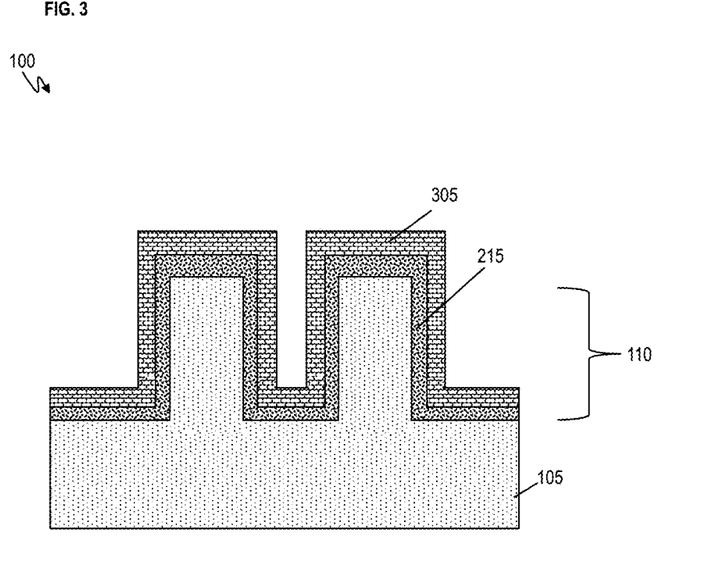
FIG. 3 is a cross-sectional view of a semiconductor device illustrating deposition of high-k material according to one or more embodiments.

Now referring to the figures, FIGS. 1-3 illustrate several example processes for fabricating semiconductor devices, such as transistors. The sources and drains have not been created and/or are not shown. One skilled in the art understands the formation of sources and drains.

FIG. 1 is a cross-sectional view of a semiconductor device 100 illustrating native oxide growth according to one or more embodiments. The semiconductor device 100 has a substrate 105. In one implementation, the substrate 105 may be a wafer. Example materials of the substrate 105 may include SiGe, Ge, InGaAs, GaAs, InAs, InAlAs, InP, and any other high mobility (III-V) semiconductor material. A high-mobility semiconductor is defined as having carrier mobility higher than the one of bulk silicon for either electron or holes. It is understood by one skilled in the art that the high mobility material used in the channels can either define the substrate bulk itself or be deposited on another material using hetero-epitaxy so as to constitute the surface of a substrate.

Fins 110 are formed in the substrate 105. An example of a finFET is depicted. However, embodiments are not limited to finFETs, and other implementations may be planar architectures, wrap-around gate designs, and three-dimensional architectures including nanosheets, nanowires, vertical FETs, etc.

A wet clean may be performed on the substrate 105. The wet clean may be standard wafer cleaning steps. In one example, the wet clean my use some sequential diluted versions of buffered oxide etch (BOE), HF, HCl, $N_4OH$, and/or $(NH_4)_2S$ as understood by one skilled in the art.

The semiconductor device 100 has an interlayer 115 that is formed on the surface of the substrate 105 including the fins 110. The interlayer 115 is a native oxide (i.e., oxide layer) formed because of air exposure to the semiconductor device 100. One or more embodiments address the interlayer 115 and the effects of the interlayer as discussed herein.

FIG. 2 is a cross-sectional view of the semiconductor device 100 illustrating etching and conversion of the native oxide according to one or more embodiments.

FIG. 2 illustrates both etching of the interlayer 115 and conversion of the interlayer 115 to a metal-oxide interlayer 215. In one implementation, the metal-oxide interlayer 215 may be aluminum oxynitride (AlON), which is composed of aluminum, oxygen, and nitrogen (in the full spectrum of relative atomic composition, i.e. stoichiometry). The metal-oxide layer 215 may be referred to as a plasma interlayer, an interface layer, and a passivation layer. The metal-oxide interlayer 215 is formed by the cycling of $NH_3$ remote plasma exposure and a metal precursor pulse. An example of the metal precursor pulse may be trimethyl aluminum (metalorganic precursor) (e.g., TMA). The application of the $NH_3$ plasma and application of the metal precursor pulse are both repeated until the adequate interlayer 215 is formed.

FIG. 3 is a cross-sectional view of the semiconductor device 100 illustrating deposition of high-k material according to one or more embodiments.

A high-k layer 305 is conformally deposited on top of the semiconductor device 100. The high-k layer 305 covers the metal-oxide interlayer 215 on the fins 110 and covers the substrate 105. In one implementation, the high-k layer 305 may be formed by atomic layer deposition (ALD). Example high-k materials for the high-k layer 305 may include $AlO_2$, $HfO_2$, $La_2O_3$, $Tm_2O_3$, etc., and/or combinations thereof.

The fabrication processes in FIGS. 1-3 can be performed in-situ, which means that the vacuum (seal) is not broken in the deposition chamber (such as an atomic layer deposition chamber), thereby further reducing the growth of native oxide and maintaining the newly formed interface before the high-k dielectric deposition.

An example of tooling used for this process is an atomic layer deposition cluster tool in which the cleaning or formation of the plasma interlayer can be achieved in a plasma-enhanced atomic layer deposition chamber. The high-k material can then be deposited in the same or another type of atomic layer deposition chamber without breaking vacuum.

After the high-k layer 305 is formed, further fabrication processes occur such as gate electrode deposition (which may include forming a work function metal (WFM) and a gate metal, which may include a metal and/or metal nitride), post deposition anneals, etc. These additional fabrication processes may be performed in other tool sets.

Figure 4:
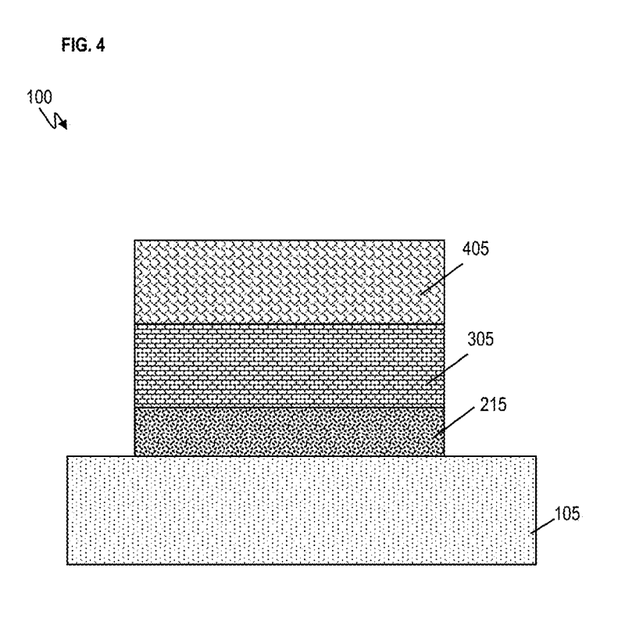
FIG. 4 is a schematic depicting a cross-section channel view of a planar semiconductor device according to one or more embodiments.

Now, turning to FIG. 4, a schematic depicts a cross-sectional view of the channel and gate stack region of a planar semiconductor device 100 according to one or more embodiments. Also, further detail is discussed with respect to formation of the interlayer 215. This example describes forming the interlayer 215 of AlON from cycling of a metal precursor (TMA) pulse and a $NH_3$ plasma.

As discussed herein, the wet clean may be performed to clean the surface of the substrate 105. To etch and convert the native oxide interlayer 115 into the metal-oxide interlayer 215, example details of forming the metal oxide interlayer 215 (also referred to as a plasma interlayer) are provided. In one implementation, there may be 9 cycles of $NH_3$ remote plasma exposure each followed by a purge and a TMA pulse (metal precursor pulse) followed by a purge. The alternating applications of $NH_3$ plasma and TMA finish with the last $NH_3$ plasma exposure. Accordingly, the metal-oxide interlayer 215 is formed.

During the fabrication process of fabricating the metal-oxide interlayer 215, the wafer temperature may be at 400° C. or less, the process pressure may be at 10 Torr or less, and the TMA pulse time may be 1 second (s) or less. It is noted that a pulse refers to the time during which the sample and chamber are exposed to the precursor, and typically a pulse is on the order of seconds via the actuation of fast switching valves. Additionally, the plasma exposure time may be 10 seconds or less, and the plasma type may be defined as inductively coupled at power of 3 kilowatts (kW) or less. As such, this yields an AlON interlayer 215 of up to 20 angstroms (Å) with the nitrogen (N) content varied by the process condition such as plasma power, substrate temperature, exposure time, etc. The nitrogen (N) content is tuned to reduce Dit while boosting the dielectric constant (k) of the interlayer 215, thereby promoting scaling and reliability. The nitrogen content may be reduced down to a negligible amount so that the interlayer 215 is defined as a pure metal-oxide, i.e., $Al_xO_y$.

Subsequently, 20-30 Å of $HfO_2$ high-k layer 305 may be formed on the metal-oxide interlayer 215. The high-k layer 305 may be formed by ALD at a substrate temperature of 300° C. or less. According to one or more embodiments, the high density of traps (Dit) at the interface of the high-k layer 305 (gate dielectric) and the semiconductor substrate 105 is reduced. The interface is the metal oxide interlayer 215. It should be appreciated that example parameters have been provided for explanation purposes, and one or more embodiments are not meant to be limited.

The reason to minimize the density of interface states (Dit) is because the Dit impacts the turn on characteristics of a transistor by screening the gate voltage, increasing scattering events, and reducing the number of free carriers. This directly translates into the degradation of the sub-threshold slope and also negatively affects the on-current of the transistor device as understood by one skilled in the art.

Accordingly, one or more embodiments provide a good interlayer 215 (also referred to as an interface layer) between the semiconductor substrate 105 and the high-k bulk material 305. The interlayer 215 (interface layer) is fabricated to provide a smooth transition between the semiconductor substrate 105 and the gate dielectric 305 with minimized trap density (Dit) at the interface and in its bulk. The interlayer 215 also has sufficient band offset to reduce leakage while having a high enough dielectric constant (k) to enable scaling of the capacitance. Ultimately both quality (on/off properties) and reliability (parameter drift and failure) of the transistor device rely on these parameters.

There are benefits of using of $NH_3$ plasma according to one or more embodiments over $H_2$ plasma in the state-of-the-art. Other than fundamental benefits of combining N and H species, the use of $NH_3$ has practical implications as well. H, NH, and $NH_2$ radicals and atomic species are generated in $NH_3$ plasma, and the transportation rate to substrate of radical and atomic H-containing species is increased (when using the $NH_3$ plasma over using the $H_2$ plasma) due to the secondary reaction with $NH_x$ radicals. Therefore, a wider range of tooling and process conditions (temperature, pressure, etc.) can be used for the implementation of the interlayer conversion process using the $NH_3$ plasma and for the optimization of the N incorporation, all of which is in contrast to using $H_2$ plasma.

According to one or more embodiments, there are benefits of using of $NH_3$ plasma over $N_2$ plasma, such as the tuning and reduction of the nitrogen incorporation. As example comparisons, FIG. 5 is a transmission electron microscope (TEM) image of a semiconductor device 500 using $N_2$ plasma in combination with TMA pulses for interlayer conversion in the state-of-the-art, while FIG. 6 is a transmission electron microscope (TEM) image of a semiconductor device 100 using $NH_3$ plasma in combination with TMA pulses for interlayer conversion according to one or more embodiments.

Figure 5:
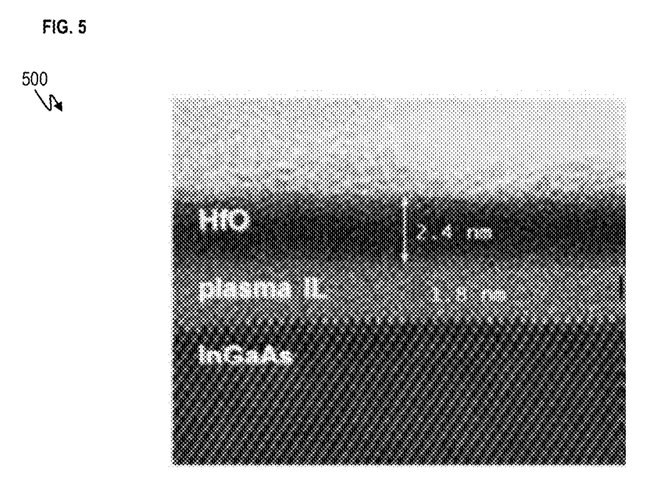
FIG. 5 is a transmission electron microscope (TEM) image of a semiconductor device using $N_2$ plasma for interlayer conversion in the state-of-the-art.
Figure 6:
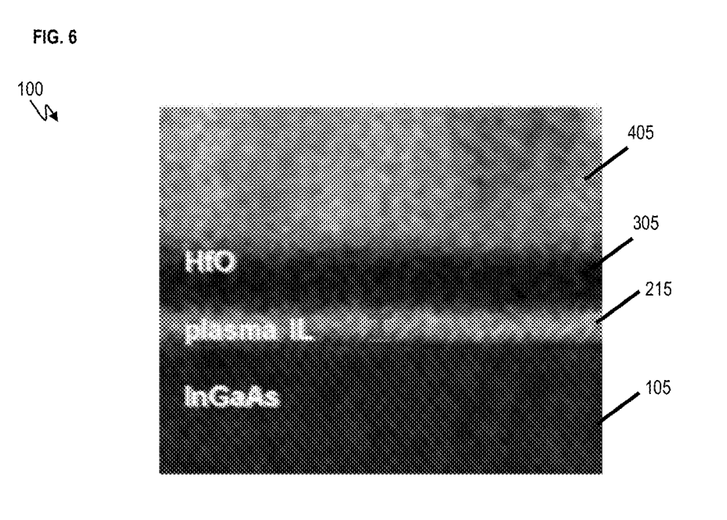
FIG. 6 is a transmission electron microscope (TEM) image of a semiconductor device using $NH_3$ plasma for interlayer conversion according to one or more embodiments.

In both FIGS. 5 and 6, the substrate is InGaAs and the high-k dielectric material is $HfO_2$. However, in the semiconductor device 500 in FIG. 5, the plasma interlayer is about 1.8 nm thick and is heavily nitrided (i.e., a heavy amount of nitrogen (N)). In addition to large Dit, the thickness of that layer yields a significant contribution in the capacitance equivalent thickness of the device and hampers scaling.

In FIG. 6, the plasma interlayer 215 in semiconductor device 100 is thinner than the plasma interlayer in the semiconductor device 500 of FIG. 5. The plasma interlayer 215 in FIG. 6 is contains less nitrogen (N). Having more nitrogen (N) in the plasma interlayer (such as in AlON) has been correlated to higher Dit. Accordingly, the plasma interlayer 215 formed using $NH_3$ plasma and TMA in FIG. 6 has a lower Dit than a plasma interlayer formed using $N_2$ plasma and TMA.

Figure 7:
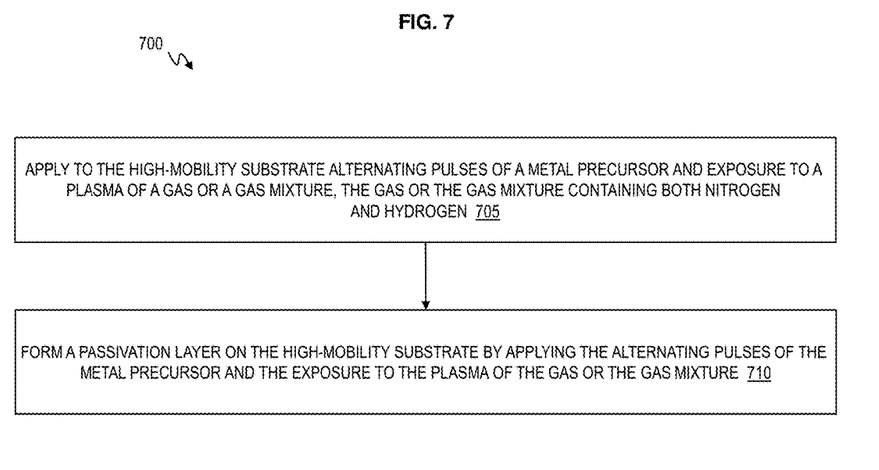
FIG. 7 is a flow chart of a method of cleaning of a high-mobility substrate according to one or more embodiments.

FIG. 7 is a flow chart 700 of a method of in-situ cleaning of a high-mobility substrate 105 according to one or more embodiments. Reference can be made to FIGS. 1-4 and 6.

At block 705, alternating exposure to a gas or gas mixture containing both hydrogen and nitrogen (e.g., $NH_3$) and pulsing of a metal precursor are applied to the high-mobility substrate 105.

At block 710, a passivation layer (i.e., interface layer 215) is formed on the high-mobility substrate 105 by application of the alternating pulses of the metal precursor and exposure to the plasma of the gas/gas mixture, containing both nitrogen and hydrogen (e.g. $NH_3$).

The $NH_3$ is a plasma. The metal precursor is trimethyl aluminum (TMA). The in-situ cleaning is processing in a vacuum without breaking the seal. The passivation layer 215 formed by $NH_3$ plasma has less nitrogen than any passivation layer formed by $N_2$ plasma, and the nitrogen content of the passivation layer is configured to be tuned with process conditions.

The passivation layer 215 formed by $NH_3$ has more radical or atomic H-containing species reaching the surface than any passivation layer formed by $H_2$. The metal precursor is a metal organic precursor. The high-mobility substrate is a material selected from the group consisting of SiGe, Ge, InGaAs, GaAs, InAs, InP, InAlAs and/or other III-V compounds.

A high-k material 305 is formed on the passivation layer 215. The passivation layer is an interlayer 215 formed between the high-mobility substrate 105 and the high-k material 305. The $NH_3$ plasma and the metal precursor form the passivation layer as AlO(N).

The exposure of the $NH_3$ remote plasma enables a higher density of reactive hydrogen-containing species reaching a surface of the high-mobility substrate as compared to a $H_2$ remote plasma, therefore enabling tenability and a wider range of compatible toolsets.

Figure 8:
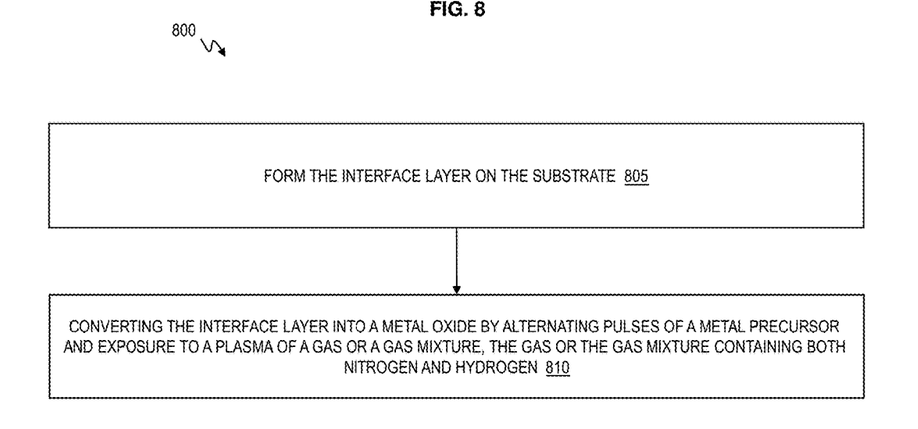
FIG. 8 is a flow chart of a method of forming an interface layer on a substrate according to one or more embodiments.

FIG. 8 is a flow chart 800 of a method of forming an interface layer 215 on a substrate 105 according to one or more embodiments. Reference can be made to FIGS. 1-4, 6, and 7.

At block 805, the interface layer 115 is formed on the substrate 105. At block 810, the interface layer 115 is converted into a metal oxide layer 215 by alternating pulses of a metal precursor and exposure to a plasma of a gas or gas mixture that contains both nitrogen and hydrogen (e.g., $NH_3$).

When converting the interface layer 115 into the metal oxide interface layer 215 comprises alternating pulses of the metal precursor and exposure to the plasma of the gas/gas mixture that contain both nitrogen and hydrogen (e.g. $NH_3$). The metal precursor is trimethyl aluminum (TMA).

Alternating between applying the $NH_3$ plasma and applying the metal precursor to convert the interface layer into the metal oxide is performed in-situ. The metal precursor is a metal organic precursor. The substrate 105 is a material selected from the group consisting of SiGe, Ge, InGaAs, GaAs, InAs, and InAlAs. A high-k material 305 is formed on the interface layer 215. The metal oxide layer 215 is AlO(N). The high-k layer can be deposited in-situ to the interface formation so as to maintain the surface properties by avoiding air exposure. It is noted that the alternating pulses of the metal precursor and the exposure to the plasma of the gas or the gas mixture are performed in-situ to the interface conversion to the metal oxide and the high-k material deposition.

Figure 9:
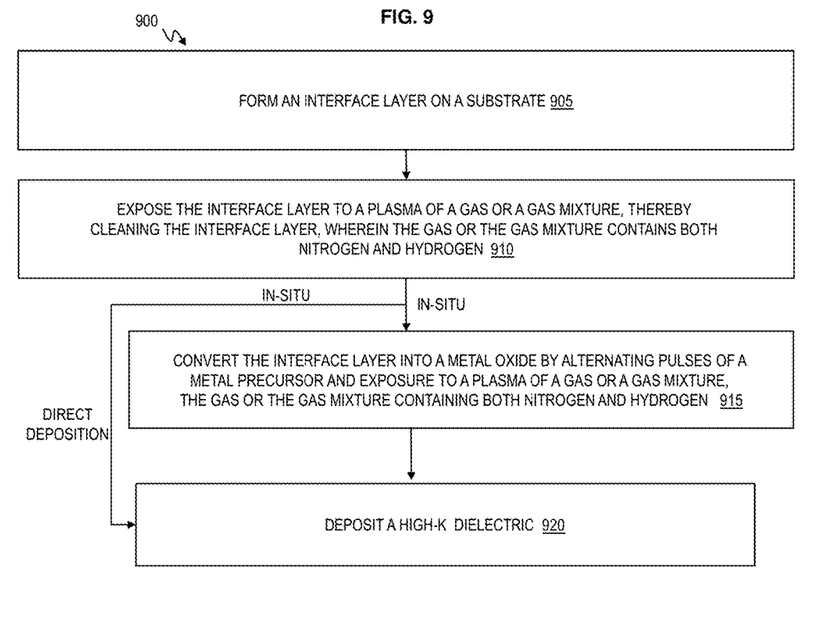
FIG. 9 is a flow chart of a method of cleaning a semiconductor device followed by gate stack formation according to one or more embodiments.

FIG. 9 is a flow chart 900 of a method of in-situ cleaning for a semiconductor device 100 according to one or more embodiments. Reference can be made to FIGS. 1-4, 6, 7, and 8.

At block 905, an interface layer 115 is formed on a substrate 105.

At block 910, the interface layer 115 is exposed to a plasma of a gas or a gas mixture, thereby cleaning the interface layer 115, where the gas or the gas mixture contains both nitrogen and hydrogen.

At block 915, the interface 115 is exposed in-situ to the preceding clean treatment to alternate pulses of a metal precursor and exposure to a plasma of a gas or a gas mixture containing at least both hydrogen and nitrogen species to form a metal-oxide interface layer 215. A high-k material 305 is then formed on top of the cleaned interface layer 215 at block 920.

Optionally, block 915 may be skipped, and the flow proceeds directly to block 920 in which a high-k dielectric material 305 can be deposited in-situ directly on the interface surface 115 treated with the plasma of gas/gas mixture containing both hydrogen and nitrogen.

Figure 10:
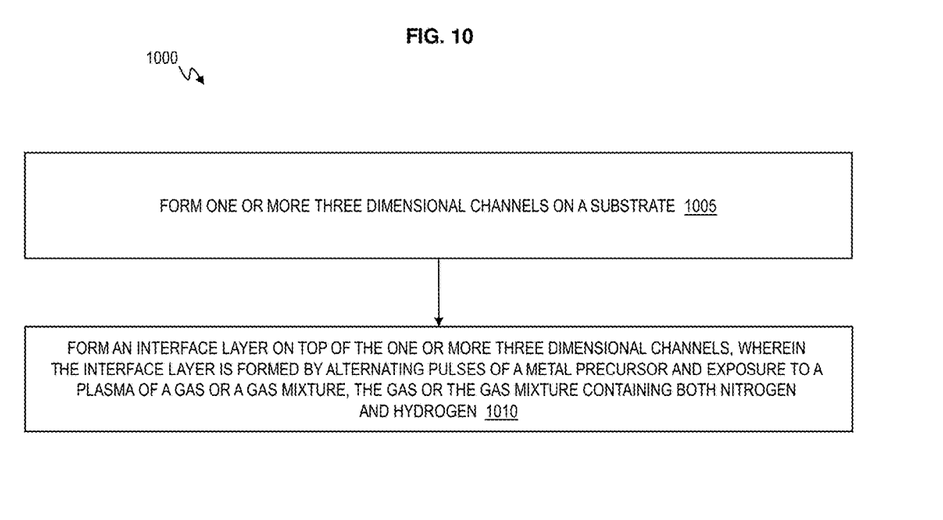
FIG. 10 is a flow chart of a method of forming a semiconductor device according to one or more embodiments.

FIG. 10 is a flow chart 1000 of a method of forming a semiconductor device 100 according to one or more embodiments. Reference can be made to FIGS. 1-4 and 6-9.

At block 1005, one or more three dimensional channels (such as fins 110) are formed on a substrate 105. At block 1005, an interface layer 215 is formed on top of the one or more three dimensional channels, where the interface layer 215 is formed by alternating pulses of a metal precursor and exposure to a plasma of a gas or a gas mixture. The gas or the gas mixture contains both nitrogen and hydrogen.

A high-k material 305 is formed on top of the interface layer. The one or more three dimensional channels, the interface layer 215 on top of the one or more three dimensional channels, and the high-k material 305 on top of the interface layer are all part of a transistor (device 100). The one or more three dimensional channels is selected from a group consisting of a fin, a nanowire, a vertical channel, and a nanosheet.

Technical effects and benefits include improved semiconductor devices and methods, by utilizing, for example the combined benefits of reactive H (native oxide removal) and N species (seed layer for nucleation) using a plasma of a gas containing at least both elements (e.g., $NH_3$). Technical benefits provide a novel structure and method, performed in-situ, of alternating pulses of the $NH_3$ plasma and a metal precursor (such as, e.g., trimethyl aluminum (TMA)) in order to form a passivation layer (e.g., AlO(N)) that serves as a seed for the core dielectric material (e.g., HfO) while providing an interface with the semiconductor with minimum Dit. The lower Dit correlates with reduced subthreshold slope in a FET, lower leakage, and improved capacitance scaling for electrostatic control.

It should be appreciated that the design for semiconductor devices may be included in or utilize features of an integrated circuit layout. An integrated circuit (IC) layout is also known as an IC layout, IC mask layout, or mask design. The integrated circuit layout is the representation of an integrated circuit in terms of planar geometric shapes which correspond to the patterns of metal, oxide, semiconductor layers, etc., that make up the components of the integrated circuit. Such an integrated circuit layout, including the layout of a semiconductor device, may be stored in a computer readable medium in preparation for fabrication as understood by one skilled in the art.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of in-situ cleaning of a substrate, the method comprising:
    applying to the substrate a combination of alternating pulses of a metal precursor and exposure to a plasma of a gas or a gas mixture, the gas or the gas mixture containing both nitrogen and hydrogen; and
    forming a passivation layer on the substrate by applying the combination of alternating pulses of the metal precursor and the exposure to the plasma of the gas or the gas mixture;
    wherein the substrate is a material selected from a group consisting of InGaAs, GaAs, InAs, InP, and InAlAs.

2. The method of claim 1, wherein the gas or gas mixture comprises $NH_3$ plasma.

3. The method of claim 1, wherein the metal precursor is trimethyl aluminum (TMA).

4. The method of claim 1, further comprising preventing a gas phase reaction between the metal precursor and the plasma of the gas or the gas mixture, wherein the passivation layer is a metal-oxide passivation layer.

5. The method of claim 2 wherein the passivation layer formed by the $NH_3$ plasma has less nitrogen than any passivation layer formed by a $N_2$ plasma; and
    wherein a nitrogen content of the passivation layer is configured to be tuned with process conditions.

6. The method of claim 2, wherein the $NH_3$ plasma is a $NH_3$ remote plasma; and
    wherein the exposure of the $NH_3$ remote plasma enables a higher density of reactive hydrogen-containing species reaching a surface of the substrate as compared to a $H_2$ remote plasma, therefore enabling tenability and a wider range of compatible toolsets.

7. The method of claim 1, wherein a high-k material is formed on the passivation layer.

8. The method of claim 7, wherein the passivation layer is an interlayer formed between the substrate and the high-k material in an in-situ process.

9. The method of claim 7, wherein the high-k material is selected from a group consisting of $AlO_2$, $HfO_2$, $La_2O_3$, $Tm_2O_3$, and any combination thereof.

10. The method of claim 1, wherein the alternating pulses of the metal precursor and the exposure to the plasma form the passivation layer as AlO(N).

11. A method of forming a thin film on a substrate, the method consisting of:
    forming an interface layer containing oxygen on the substrate;
    converting the interface layer into a metal oxide passivation layer by a combination of repeatedly alternating only pulses of a metal precursor and exposure to a plasma of a gas or a gas mixture, the gas or the gas mixture containing both nitrogen and hydrogen; and
    depositing a high-k layer on the metal oxide passivation layer.

12. The method of claim 11, wherein the metal precursor is trimethyl aluminum (TMA); and
    wherein the gas or the gas mixture containing both nitrogen and hydrogen is $NH_3$.

13. The method of claim 11, wherein forming the interface layer on the substrate comprises plasma exposure of a gas or a gas mixture containing both hydrogen and nitrogen.

14. The method of claim 11, wherein the substrate is a material selected from a group consisting of InGaAs, GaAs, InAs, InP, and InAlAs.

15. The method of claim 11, wherein the high-k material is selected from a group consisting of $AlO_2$, $HfO_2$, $La_2O_3$, $Tm_2O_3$, and any combination thereof; and
    wherein the alternating pulses of the metal precursor and the exposure to the plasma of the gas or the gas mixture is performed in-situ to the interface conversion to the metal oxide and the high-k material deposition.

16. The method of claim 11, wherein the metal oxide passivation layer is AlO(N).

17. A method of forming a semiconductor device, the method comprising:
    forming one or more three dimensional channels on a substrate; and
    forming an interface layer on top of the one or more three dimensional channels, wherein the interface layer is formed by a combination of alternating pulses of a metal precursor and exposure to a plasma of a gas or a gas mixture, the gas or the gas mixture containing both nitrogen and hydrogen;
    wherein the substrate is a material selected from a group consisting of InGaAs, GaAs, InAs, InP, and InAlAs.

18. The method of claim 17, wherein a high-k material is formed on top of the interface layer.

19. The method of claim 18, wherein the one or more three dimensional channels, the interface layer on top of the one or more three dimensional channels, and the high-k material on top of the interface layer are all part of a transistor; and
    wherein the one or more three dimensional channels is selected from a group consisting of a fin, a nanowire, a vertical channel, and a nanosheet.

* * * * *